United States Patent
Bandai

(10) Patent No.: US 9,209,633 B2
(45) Date of Patent: Dec. 8, 2015

(54) CHARGING APPARATUS AND METHOD FOR DETERMINING CONDUCTION STATE

(75) Inventor: Masahiro Bandai, Isehara (JP)

(73) Assignee: Nissan Motor Co., Ltd., Yokohama (JP)

( * ) Notice: Subject to any disclaimer, the term of this patent is extended or adjusted under 35 U.S.C. 154(b) by 265 days.

(21) Appl. No.: 13/979,314

(22) PCT Filed: Jan. 16, 2012

(86) PCT No.: PCT/JP2012/050705
§ 371 (c)(1),
(2), (4) Date: Jul. 11, 2013

(87) PCT Pub. No.: WO2012/099052
PCT Pub. Date: Jul. 26, 2012

(65) Prior Publication Data
US 2013/0293188 A1 Nov. 7, 2013

(30) Foreign Application Priority Data
Jan. 18, 2011 (JP) .................. 2011-007577

(51) Int. Cl.
*H02J 7/00* (2006.01)
*G01R 31/02* (2006.01)

(52) U.S. Cl.
CPC ............. *H02J 7/0042* (2013.01); *H02J 7/0006* (2013.01); *H02J 7/0068* (2013.01); *G01R 31/026* (2013.01)

(58) Field of Classification Search
USPC ................................................ 320/100–110
See application file for complete search history.

(56) References Cited

U.S. PATENT DOCUMENTS

| 7,688,024 B2 | 3/2010 | Kamaga |
| 7,773,353 B2 | 8/2010 | Uchida |
| 8,384,358 B2 | 2/2013 | Biondo et al. |
| 2008/0088276 A1* | 4/2008 | Hurst et al. ............ 320/116 |
| 2010/0194333 A1* | 8/2010 | Kassayan et al. ......... 320/108 |

FOREIGN PATENT DOCUMENTS

| CN | 1979995 A | 6/2007 |
| CN | 101379669 A | 3/2009 |
| CN | 101420132 A | 4/2009 |
| CN | 101557120 A | 10/2009 |
| CN | 201393081 Y | 1/2010 |
| CN | 101902063 A | 12/2010 |
| JP | 62-028677 A | 2/1987 |
| JP | 02-264874 A | 10/1990 |
| JP | 05-191929 A | 7/1993 |
| JP | 2007-333674 A | 12/2007 |
| JP | 2009-131823 A | 6/2009 |

OTHER PUBLICATIONS

An English translation of the Chinese Office Action for the corresponding Chinese patent application No. 201280014177.6 issued on Nov. 3, 2014.

* cited by examiner

*Primary Examiner* — Binh Tat
(74) *Attorney, Agent, or Firm* — Global IP Counselors, LLP

(57) ABSTRACT

A charging apparatus is provided with a connector, a pair of power lines, a charger, a holding part and a controller. The connector has a pair of connection terminals electrically connectable to an object to be charged. The power lines electrically connected to the connection terminals. The charger is connected to the power lines for charging the object to be charged. The holding part holds the connector. The controller is programmed to determine the conduction state on the power lines and the connection terminals. The holding part has a conduction part for bringing about conduction through the connection terminals.

17 Claims, 6 Drawing Sheets

| TABLE ||
|---|---|
| CAPACITOR VOLTAGE (V) | DETERIORATION DETERMINATION INTERVAL (ms) |
| 420 ~ 411 | 3000 |
| 410 ~ 401 | 2900 |
| 400 ~ 391 | 2800 |
| • | • |
| • | • |
| • | • |
| • | • |
| • | • |
| • | • |

FIG. 5

CHARGING APPARATUS AND METHOD FOR DETERMINING CONDUCTION STATE

CROSS-REFERENCE TO RELATED APPLICATIONS

This application is a U.S. National stage application of International Application No. PCT/JP2012/050705, filed Jan. 16, 2012, which claims priority claims priority under to Japanese Patent Application No. 2011-7577, filed in Japan on Jan. 18, 2011, the entire contents of which is hereby incorporated by reference.

BACKGROUND

1. Field of the Invention

The present invention relates to a charging apparatus and to a method for determining conduction state.

2. Background Information

A cable connection diagnosis device equipped with impedance measurement means for measuring impedance values between signal lines of a cable connected to a connection object, comparison means for comparing the impedance value measured by the impedance measurement means to a threshold value, notification means for notification of the result of the comparison; and a power supply for driving these, is known (See Japanese Laid-Open Patent Application 2007-333674).

SUMMARY

However, in the aforedescribed cable connection diagnosis device, a diagnostic device that includes a power supply is employed in order to diagnose a malfunction of a cable connected to a connection object. A resultant problem is that, for example, in the case of diagnosis of a malfunction of a cable for high-current use, a power supply for outputting high current must be prepared separately from the power supply for diagnostic purposes.

The problem which the present invention is intended to solve is to provide a charging apparatus and a method for determining conduction state, whereby the conduction state of a connector and a power line can be determined without employing a power supply for malfunction diagnostic purposes.

The present invention solves the aforedescribed problem by having determining means for determining the conduction state in power lines and connector terminals, and conduction means for giving rise to conduction through the connector terminals.

According to the present invention, the connector is designed to employ the electrical power of the charging apparatus itself to conduct electricity when the connector is returned to a holder part, and the conduction state thereof is determined, whereby the conduction state in the connector and the power lines can be determined without employing a power supply for malfunction diagnostic purposes.

BRIEF DESCRIPTION OF THE DRAWINGS

Referring now to the attached drawings which form a part of this original disclosure.

FIG. 5 is a drawing showing a table stored in the controller of FIG. 1.

DETAILED DESCRIPTION OF THE EMBODIMENTS

Following is a description of the embodiments of the present invention, based on the accompanying drawings.

Figure 1:
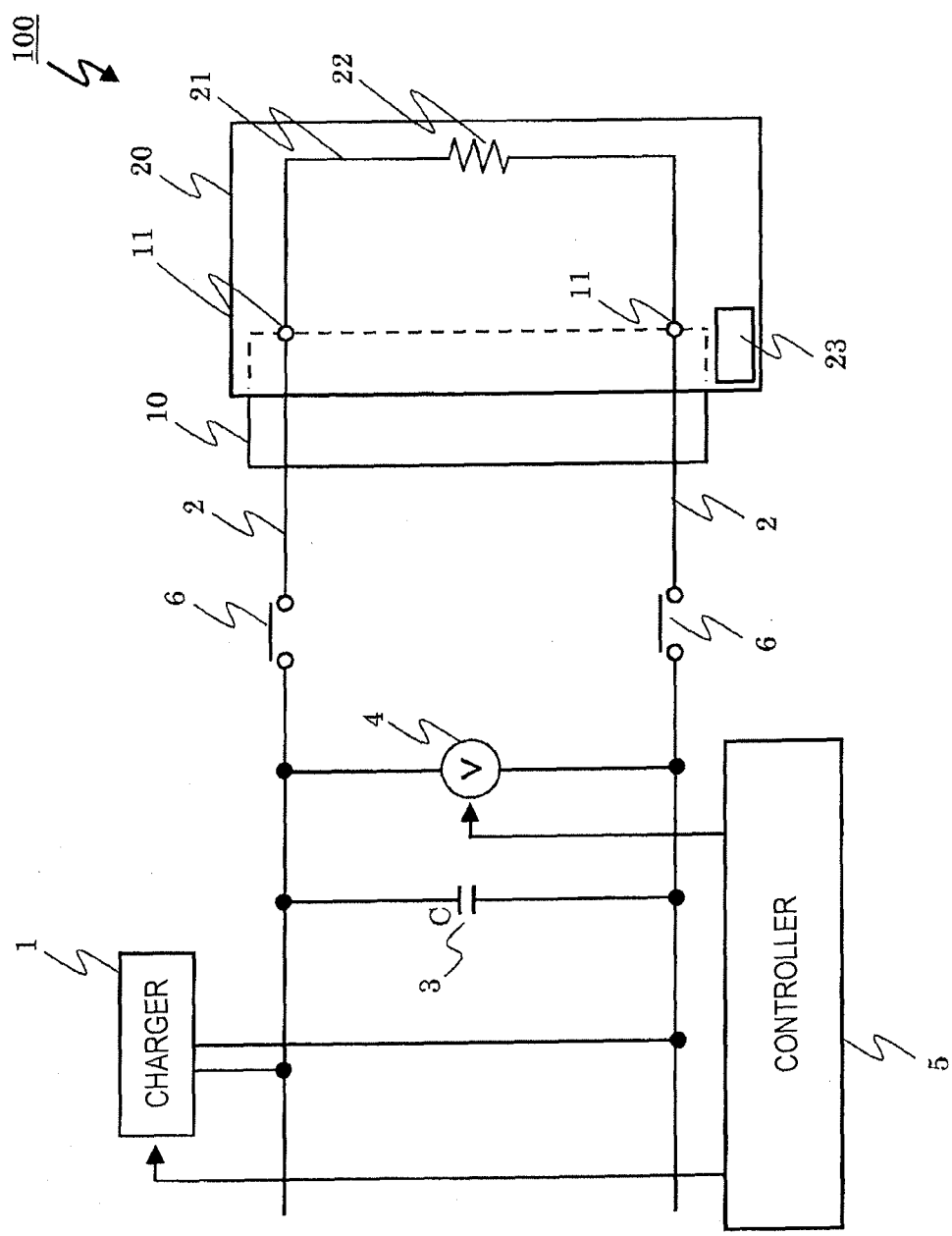
FIG. 1 is a block diagram showing the charging apparatus according to an embodiment of the present invention.
Figure 2:
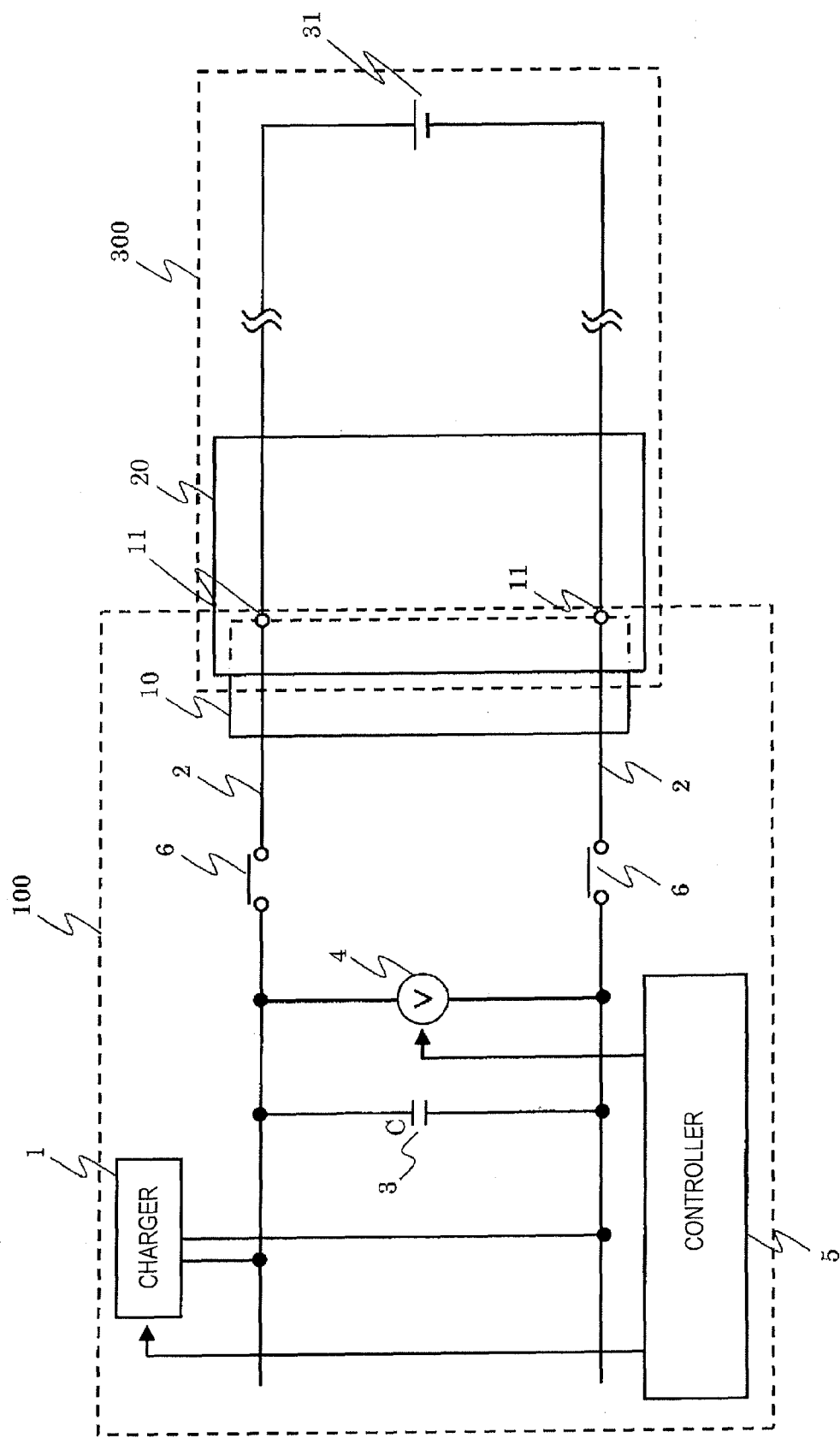
FIG. 2 is a block diagram showing the charging apparatus of FIG. 1 connected to a vehicle.

FIG. 1 is a block diagram showing the charging apparatus according to an embodiment of the present invention. FIG. 2 is a block diagram showing the charging apparatus of the present example, and a vehicle being charged by the charging apparatus. The charging apparatus of the present example is employed for charging of a vehicle such as an electric car or the like, but the present invention is applicable as well to charging apparatus for charging of systems other than vehicles equipped with secondary cells.

As shown in FIG. 1, the charging apparatus 100 of the present example is equipped with a charger 1, power lines 2, a capacitor 3, a voltage sensor 4, a controller 5, a pair of relay switches 6, a connector 10, and a connector holder 20. The charger 1 is a charger for charging secondary cells included in a vehicle, discussed later, and outputs DC power to the secondary cells via the power lines 2. The power lines 2 are power lines for heavy current use, which are connected to the charger 1. The capacitor 3 is furnished for the purpose of smoothing the DC power output by the charger 1, and is connected between the power lines 2.

The voltage sensor 4 is a sensor for detecting the voltage of the capacitor 3, and is connected to the power lines 2. The voltage sensor 4 detects the voltage of the capacitor 3 at a predetermined sampling cycle, based on a control signal from the controller 5. The relay switches 6 are switches for on/off switching of the circuit formed by the capacitor 3, a resistor 22 (discussed below), and signal lines electrically interconnecting the capacitor 3 and the line 21, and are connected midway along the power lines 2 that electrically interconnect the capacitor 3 and the resistor 22.

The controller 5 is a control section for overall control of the charging apparatus 100, and controls the charger 1, the voltage sensor 4, the relay switches 6, and a holder switch 23. The specifics of control by the controller 5 in the present example are discussed below.

The connection terminals 11 are connected to the power lines 2 at one end thereof, the connection terminals 11 being furnished to the connector 10. The connector 10 is a connector for power supply by the charging apparatus 100, and plugs into a charging socket 30 (see FIG. 2) furnished to the vehicle. In cases in which charging is not taking place, the connector 10 is held by the connector holder 20. The holder 20 is furnished with the resistor 22 and the line 21, which conduct between the connection terminals 11. The resistor 22 is connected to the line 21. With the connector 10 held by the holder 20, the connection terminals 11 are connected to the line 21 at one end thereof, giving rise to electrical conduction between the connection terminals 11 via the line 21 and the resistor 22. A description of the connecting sections of the connection terminals 11 and the line 21 is omitted herein, but it would be acceptable, for example, for the connection terminals to be three-phase output terminals, and for the distal end sections of the line 21 to be plug sockets for the three-phase output terminals.

The holder 20 is furnished with the holder switch 23. The holder switch 23 is a switch for detecting whether or not the connector 10 is being held securely by the holder 20. When the connector 10 is inserted and held at a predetermined location by the holder 20, the holder switch 23 goes on, and the holder 20 is detected to be in the held state.

Next, the use of the charging apparatus 100 of the present example to charge a vehicle will be described employing FIG. 2. The vehicle 300 is equipped with a charging socket 30 and a battery 31. The charging socket 30 has terminals (not illustrated) that connect to the connection terminals 11. These terminals are electrically connected by lines or the like to the battery 31. The battery 31 is the drive power supply for the vehicle, and is formed of a plurality of secondary cells. When the connector 10 is connected to the charging socket 30, the connection terminals 11 and the battery 31 are electrically connected. The user removes the connector 10 from the holder 20 and plugs it into the charging socket 30.

Next, the specifics of control by the controller 5 in the present example will be described employing FIGS. 1 and 2. When charging, the connector 10 is removed from the holder 20, severing the electrical connection between the connection terminals 11 and the battery 31. The connector 10 is then plugged into the charging socket 30 as shown in FIG. 2, completing preparations for charging. Based on a charge command from the user, the controller 5 turns on the relay switches 6. Once the relay switches 6 turn on, there is electrical conduction between the charger 1 and the battery 31. The controller 5 verifies the conduction state between the charger 1 and the battery 31, the state of the battery 31 such as its remaining capacity and the like, and controls the charger 1 to charge the battery 31. As power is supplied from the charger 1 to the battery 31, charge accumulates in the capacitor 3, and the voltage of the capacitor 3 rises to a voltage commensurate with the rated capacity. Once the battery 31 has been charged to the desired capacity, the controller 5 terminates charging, and turns off the relay switches 6. The connector 10 is then removed from the charging socket 30. During this time, the charge that has accumulated in the capacitor 3 is maintained.

The connector 10 is returned to its original position in the holder 20. The holder switch 23 is actuated when the holder 20 holds the connector 10. The controller 5 receives a detection signal from the holder switch 23 to verify that the connector 10 is being held by the holder 20. Through the voltage sensor 4, the controller 5 detects the voltage of the capacitor 3. The controller 5 detects the voltage of the capacitor 3, when the connector 10 is held by the holder 20 subsequent to charging.

The controller 5 then turns on the relay switches 6, discharging the charge that has accumulated in the capacitor 3. During discharge of the charge, the controller 5 controls the voltage sensor 4 and detects the voltage of the capacitor 3 according to a predetermined sampling cycle, and manages the discharge state of the capacitor 3 based on the voltage detected by the voltage sensor 4.

Figure 3:
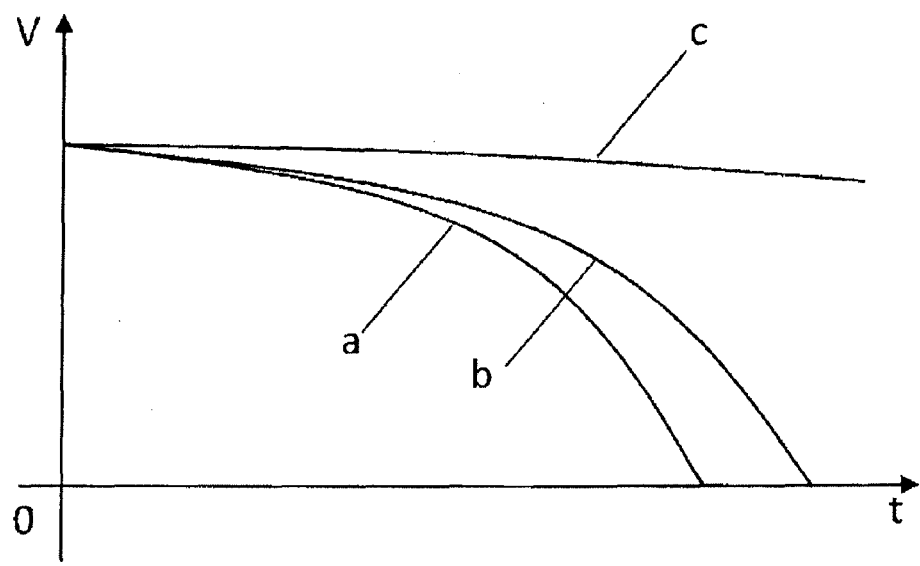
FIG. 3 is a graph showing characteristics of the detected voltage of a capacitor versus the discharge interval in the charging apparatus of FIG. 1.

Here, the discharge state of the capacitor 3 is described employing FIG. 3, in terms of transitions of the detected voltage versus discharge time, while discussing in detail the conduction state of the power lines 2 and the connection terminals 11 of the connector 10. FIG. 3 is a graph showing characteristics of the detected voltage of the capacitor 3 versus the discharge time. Graph a shows the characteristics when both the power lines 2 and the connection terminals 11 are in normal states; graph b shows the characteristics observed in a state in which a contact fault has arisen in a connecting section of the connection terminals 11; and graph c shows the characteristics observed in a state in which a wire break malfunction has occurred on the power lines 2.

In a case in which both the power lines 2 and the connection terminals 11 are in normal states and electrical conduction exists from the capacitor 3 to the resistor 22, when the relay switches 6 are turned on, the charge of the capacitor 3 is consumed by the resistor 22 and is gradually discharged. Therefore, the detected voltage of the capacitor 3 gradually drops due to discharge of the charge of the capacitor 3. At the point in time that discharge is completed, the detected voltage of the capacitor 3 goes to zero.

In cases in which a contact fault has arisen in a connecting section between the connection terminals 11 and the line 21 due to factors such as deterioration of the connection terminals 11 over time or the like, the discharge rate of the capacitor 3 will be slower than in the case in which both the power lines 2 and the connection terminals 11 are in normal states. Therefore, with the voltage of the capacitor 3 at the outset of discharge set to identical conditions, the discharge time of the capacitor 3 in a case in which a contact fault has arisen in a connecting section between the connection terminals 11 and the line 21 will be longer than the discharge time in normal cases, as shown by graph b in FIG. 3.

In a case in which a wire break malfunction has occurred on the power lines 2, there is substantially no discharge of the capacitor 3 even when the relay switches 6 have been turned on, and there is no appreciable change in the detected voltage of the capacitor 3, as shown by graph c in FIG. 3.

Specifically, in a case in which, subsequent to charging, the connector 20 is held in the holder, and the capacitor 3 is caused to discharge its charge, the discharge state of the charge of the capacitor 3 varies according to the conduction state of the power lines 2 and the connection terminals 11. The discharge state can be ascertained from the detected voltage of the capacitor 3 during discharge.

In the present example, the controller 5, having established beforehand a wire break detection interval and a deterioration determination interval, switches on the relay switches 6 in order to discharge the capacitor 3, and establishes the deterioration determination interval according to the detected voltage by the voltage sensor 4 prior to discharge.

The wire break detection interval is an interval that has been established for the purpose of detecting a wire break malfunction on the power lines 2. As shown in FIG. 3, in a case in which a connection on the power lines 2 has been disestablished, there is substantially no discharge of the capacitor 3. Therefore, the wire break detection interval is set by way of a timeout interval.

The deterioration determination interval is equal to the discharge interval of the capacitor 3 in the case in which both the power lines 2 and the connection terminals 11 are in normal states, or to an interval somewhat longer than the discharge interval in question, and constitutes an interval for determining the connection states of the connection terminals 11. In cases in which the interval from the outset of discharge until the voltage of the capacitor 3 reaches zero is longer than the deterioration determination interval, it is determined that a contact fault has arisen in a connecting section of the connection terminals 11. The amount of charge accumulated in the capacitor 3 subsequent to charging is a function of the capacity of the capacitor 3. The discharge interval is a function of the circuit connected to the capacitor 3, through which circuit discharge takes place. Because the capacity of the capacitor 3, the resistance value of the resistor 22, and so on have been established beforehand, the discharge interval needed for the voltage of the capacitor 3 to reach zero can be established beforehand as well. Therefore, the deterioration determination interval can also be established beforehand during the design stage.

Figure 4:
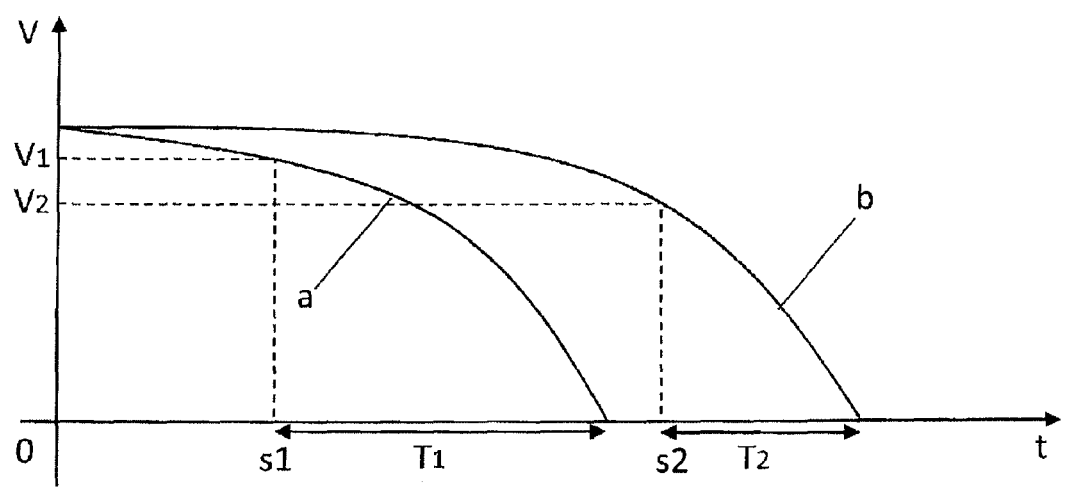
FIG. 4 is a graph showing characteristics of the detected voltage of a capacitor versus the discharge interval in the charging apparatus of FIG. 1.

Self-discharge by the capacitor 3 is described here, employing FIG. 4. FIG. 4 is a graph showing characteristics of the detected voltage of the capacitor 3 versus time. Graph a in FIG. 4 shows the characteristics observed in a case in which the relay switches 6 are turned on at the point in time of time ($s_1$). Graph b shows the characteristics observed in a case in which the relay switches 6 are turned on at the point in time of time ($s_2$). Time ($s_2$) is a time that follows time ($s_1$). The respective characteristics have as the base point the voltage of the capacitor 3 prior to the relay switches 6 going on, these voltages being identical voltages.

From the time that charging is completed until the relay switches 6 are turned on, the charge of the capacitor 3 is self-discharged. Therefore, as shown in FIG. 4, even in cases in which the voltage of the capacitor 3 at the completion of charging is the same given voltage, the drop voltage of the capacitor 3 associated with self-discharge will differ depending on the timing at which the relay switches 6 are turned on. Therefore, as shown by graph a, in cases in which the time ($s_1$) from holding of the connector 10 in the holder 20 subsequent to completion of charging to turning on of the relay switches 6 is short, the detected voltage ($V_1$) at that time that the relay switches 6 are turned on is high, and the discharge interval ($T_1$) for the voltage of the capacitor 3 to go to zero once the relay switches 6 are turned on is long. On the other hand, as shown by graph c, in a case in which the time ($s_2$) from when the connector 10 is held in the holder 20 subsequent to completion of charging until the relay switches 6 are turned on is longer than in the case of graph a, the self-discharge interval is longer as well, and therefore the detected voltage ($V_2$) at the time that the relay switches 6 turn on is lower than the detected voltage ($V_1$), and the discharge interval ($T_2$) for the voltage of the capacitor 3 to go to zero once the relay switches 6 are turned on is shorter than the discharge interval ($T_1$).

The table shown in FIG. 5 is stored in advance in the controller 5, and based on the detected voltage of the capacitor 3 prior to the relay switches 6 turning on, the controller 5 references the table and sets the deterioration determination interval. FIG. 5 is a table showing correspondence between the voltage of the capacitor 3 and the deterioration determination interval.

As shown in FIG. 4, the discharge interval differs depending on the voltage of the capacitor 3 when the relay switches 6 turn on, discharging the capacitor 3. Therefore, as shown in FIG. 5, in the present example, the voltage of the capacitor 3 at the outset of discharge is divided beforehand into a plurality of voltage ranges, and a deterioration determination interval is assigned to each of the plurality of voltage ranges. In cases of high voltage of the capacitor 3 at the outset of discharge, the discharge interval needed for the voltage of the capacitor 3 to go to zero is longer, and therefore a longer deterioration determination interval is assigned to voltage ranges of high voltage.

For example, in a case in which the detected voltage of the capacitor 3 immediately prior to the relay switches 6 turning on after charging is 415 (V), the controller 5 looks up the table of FIG. 5, and sets the deterioration determination interval to a discharge interval of 3000 (ms), which corresponds to a voltage range (420-411 (V)) that includes the detected voltage of 415 (V).

With the point in time that the relay switches 6 turn on as the base point, the controller 5 measures the discharge interval, and compares the measured discharge interval to the deterioration determination interval and the wire break determination interval, respectively. In cases in which the discharge interval for the voltage of the capacitor 3 to go to zero is equal to or less than the deterioration determination interval, the controller 5 decides that discharge is proceeding normally, and that the conduction state on the power lines 2 and the connection terminals 11 is normal. On the other hand, in cases in which the measured discharge interval is longer than the deterioration determination interval, the controller 5 decides that discharge is taking longer because discharge is not proceeding normally, and that the connection state of the connection terminals 11 is abnormal. In cases in which an abnormal connection state of the connection terminals 11 has arisen, the controller 5 may, for example, prompt display by a warning lamp (not illustrated) furnished to the charging apparatus 100, to alert the user of the abnormal condition.

Moreover, in cases in which the discharge interval prior to the detected voltage of the capacitor 3 going to zero once the relay switches 6 have turned on is longer than the wire break determination interval, the controller 5 decides that a wire break malfunction has arisen on the power lines 2. In cases in which a wire break malfunction has arisen, the controller 5 may, for example, prompt display by a warning lamp (not illustrated) furnished to the charging apparatus 100 to alert the user of the abnormal condition.

Figure 6:
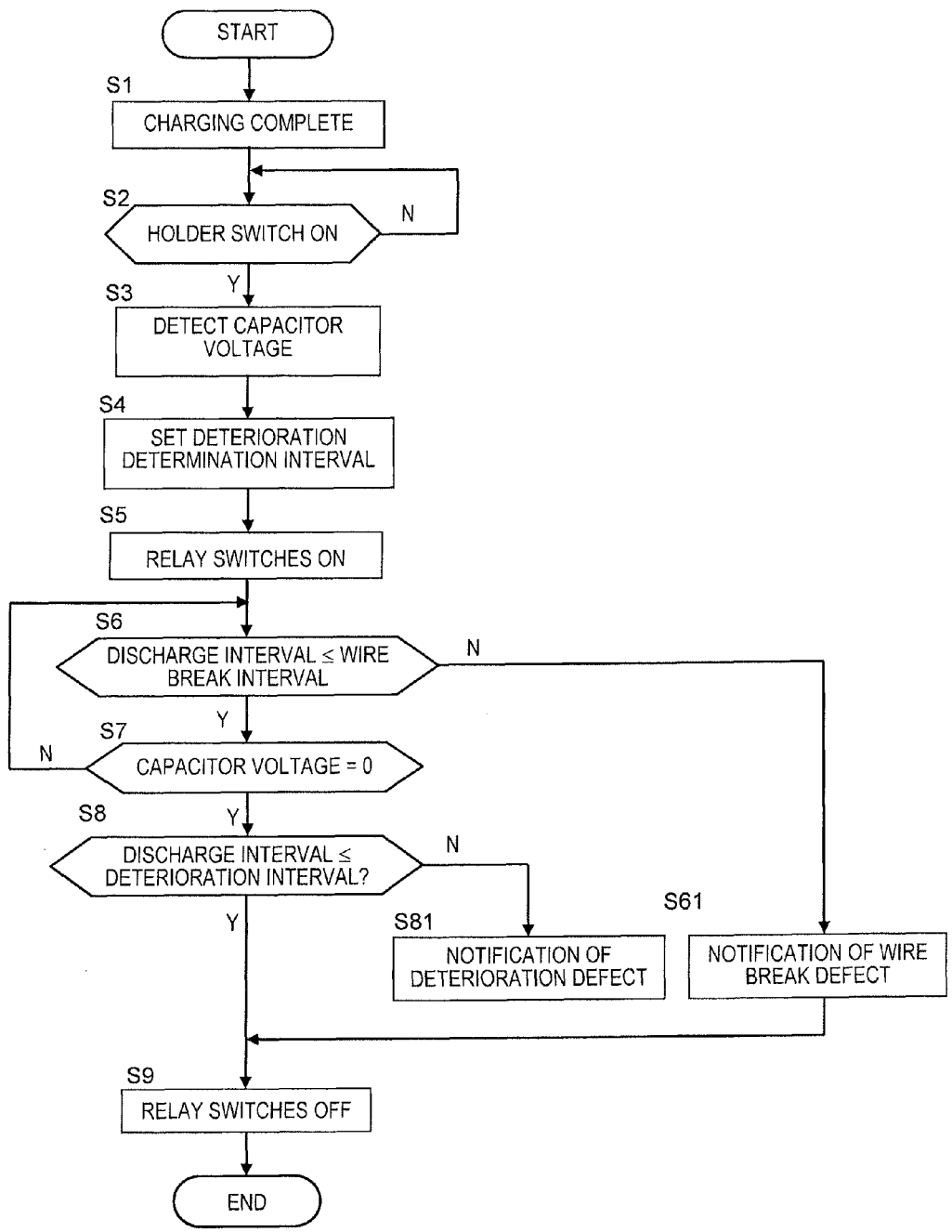
FIG. 6 is a flowchart showing the control procedure of the charging apparatus of FIG. 1.

Next, the control procedure of the present example will be described, employing FIG. 6. FIG. 6 is a flowchart showing the control procedure of the charging apparatus 100 of the present example.

As shown in FIG. 6, in Step S1, charging is completed and the connector 10 is held by the holder 20. In Step S2, the holder switch 23 detects holding of the connector 10 and turns on, sending the controller 5 a signal showing that the connector 10 is held. In a case of having received the signal in question, the controller 5 decides that the connector 10 is held by the holder 20, and advances to Step S3. On the other hand, in a case of not having received the signal in question, the controller 5 returns to Step S2.

In Step S3, the controller 5 controls the voltage sensor 4 to detect the voltage of the capacitor 3 in a predetermined sampling cycle. In Step S4, the controller 5 looks up in the table shown in FIG. 5, and sets the deterioration determination interval to the discharge interval that corresponds to the detected voltage in Step S3. In Step S5, the controller 5 turns on the relay switches 6, discharging the capacitor 3. The controller 5 also measures the discharge interval after turning on the relay switches. In Step S6, the controller 5 compares the measured discharge interval to the wire break determination interval, and in cases in which the measured discharge interval is longer than the wire break determination interval, advances to Step S61. In Step S61, the controller 5 decides that a wire break malfunction has arisen on the power lines 2, illuminates a display lamp or the like (not shown) to alert of the wire break malfunction, and advances to Step S9.

In a case in which the measured discharge interval is equal to or less than the wire break determination interval, the controller 5 advances to Step S7. In Step S7, the controller 5 determines whether the detected voltage of the capacitor 3 has reached zero. In a case in which the detected voltage of the capacitor 3 has reached zero, the controller 5 measures the discharge interval needed for the detected voltage of the capacitor 3 to reach zero, and advances to Step S8. In a case in which the detected voltage of the capacitor 3 is not zero, the controller 5 returns to Step S6. Specifically, through loop control of the comparative decision in Step S6 and of Step S7, in cases in which the detected voltage of the capacitor 3 has not reached zero, and the discharge interval has exceeded the wire break determination interval, the controller 5 can decide that a wire break malfunction has occurred on the power lines 2.

In Step S8, the controller 5 compares the discharge interval needed for the detected voltage of the capacitor 3 to reach zero to the deterioration determination interval. In a case in which the discharge voltage is equal to or less than the deterioration determination interval, the controller 5 decides that the conduction states of the power lines 2 and the connection terminals 11 are normal, and advances to Step S9. In a case in which the discharge interval is longer than the deterioration determination interval, the controller 5 decides that discharge of the capacitor 3 is not proceeding adequately and that a malfunction due to deterioration of the connection terminals 11 has occurred; illuminates a display lamp (not illustrated) or the like to alert of the deterioration malfunction; and advances to Step S9.

Then, in Step S9, the controller 5 turns off the relay switches 6, and the control process of the present example terminates.

In the aforedescribed present example, once the connector 10 is held in the holder 20, the power lines 2 and the connection terminals 11 are made to conduct power from the charging apparatus 100, and their conduction states are determined. In so doing, defects on the power lines 2 and the connection terminals 11 can be detected without employing a separate power supply for malfunction diagnostic purposes.

In the charging apparatus 100 of the present example, once the connector 10 is held in the holder 20, charge accumulated in the capacitor 3 is discharged via the power lines 2 and the connection terminals 11, and the conduction states of the power lines 2 and the connection terminals 11 are determined based on the discharge state. The discharge state of the capacitor 3 is affected in cases in which a wire break on the power lines 2, or a contact fault due to deterioration of the connection terminals 11, has arisen. For this reason, in the present example, defects on the power lines 2 and the connection terminals 11 can be detected by detecting the discharge state. Moreover, in the present example, because the charge of the capacitor 3 is utilized to determine whether a connection defect exists, a power supply for the purposes of detecting defects on the power lines 2 and the connection terminals 11 can be dispensed with. Moreover, in the present example, because the charge of the capacitor 3 can be discharged concomitantly with detection of the conduction states on the power lines 2 and the connection terminals 11, accumulation of charge in the capacitor 3 for extended periods can be prevented, and a more highly stable system can be provided.

Moreover, in the present example, a deterioration determination interval that has been established as a discharge threshold value interval is compared to the discharge interval, and in cases in which the discharge interval is longer than the deterioration determination interval, it is determined that a defect in the conduction state has arisen on the power lines 2 or the connection terminals 11. In so doing, contact faults due to deterioration of the connection terminals 11, or wire break defects on the power lines 2, can be determined from the discharge state of charge from the capacitor 3, as a result of which a power supply for the purpose of detecting defects of conduction state on the power lines 2 and the connection terminals 11 can be dispensed with. The connection terminals 11 are locations of repeated connection to the vehicle charging socket 30 or the like, and there is a risk of contact defects arising due to deterioration. Moreover, in cases in which the power lines 2 leading from the connector 10 are flexible, the power lines 2 in sections thereof corresponding to flexible ones are frequently subjected to the application of pressure in the course of repeated charging, posing a risk of wire breaks on the power lines 2. In the present example, deterioration-induced defects or wire break defects of the power lines 2 can be detected from the condition of discharge of the capacitor 3, and a charging system having good usability can be provided.

Moreover, in the present example, the deterioration determination interval is set according to the detection voltage of the capacitor 3 detected prior to discharge of the charge of the capacitor 3. The discharge interval of the capacitor 3 varies according to the detected voltage of the capacitor 3 at the outset of discharge. In the present example, the threshold interval is set according to the detected voltage of the capacitor 3 at the outset of discharge, and therefore the deterioration determination interval can be set so as to correspond to differences in the voltage the outset of discharge, and the accuracy with which the conduction states on the power lines 2 and the connection terminals 11 can be determined can be increased.

Moreover, because the time from completion of charging to holding of the connector 10 in the holder 20 will differ by user, the duration of self-discharge of the capacitor 3 differs as well. Therefore, there are cases in which the voltage of the capacitor 3 at the outset of discharge differs according to conditions. In the present example, because the deterioration determination interval is set according to the detected voltage of the capacitor 3, the deterioration determination interval can be set while maintaining correspondence with the conditions of use of the connector 10 subsequent to charging, and the accuracy of determination of the conduction states on the power lines 2 and the connection terminals 11 can be increased.

Moreover, in the present example, the holder 20 is furnished with the holder switch 23, and in cases in which holding of the connector 10 is detected by the holder switch 23, the capacitor 3 is discharged. In a case in which the relay switches 6 are turned on to discharge the capacitor 3 while the connector 10 is not completely held by the holder 20, there is no electrical conduction in the connecting sections of the connection terminals 11, giving rise to the possibility that the controller 5 will erroneously detect that a wire break defect has occurred on the power lines 2. In the present example, defect of the conduction states on the power lines 2 and the connection terminals 11 is detected after verification that the connector 10 is completely held by the holder 20, so erroneous detection of the sort described above can be prevented.

Moreover, in the present example, in cases in which the power lines 2 and the connection terminals 11 are normal, it would be acceptable for the controller 5 to set the discharge interval of the capacitor 3 to the discharge threshold interval, and determine the state of deterioration of the connection terminals 11 according to the time difference between the threshold interval and the discharge interval. Specifically, in cases in which the power lines 2 and the connection terminals 11 are normal, the time difference between the threshold interval in question and the discharge interval will be small time difference that falls within the range of error. In a case in which a deterioration fault has arisen in the connection terminals 11, the time difference between the threshold interval in question and the discharge interval will be large. Therefore, in the present example, the state of deterioration of the connection terminals 11 can be determined according to the time difference between the threshold interval and the discharge interval.

In the present example, the controller 5 measures the discharge interval, and compares this to the threshold interval, to detect the discharge state of the capacitor 3; however, it would also be acceptable to detect the discharge state of the capacitor 3 from the drop voltage of the capacitor 3. As shown in FIG. 3, the rate of discharge of the capacitor 3 is fastest when both the power lines 2 and the connection terminals 11 are normal, second-fastest at times that a contact fault has arisen in a connecting section of the connection terminals 11, and slowest when there is a wire break on the power lines 2. The rate of discharge corresponds to the drop voltage of the capacitor 3 per hour. Because the controller 5 controls the voltage sensor 4 and detects the capacitor 3 in a predetermined sampling cycle, drop voltage would be detected from the detected voltage in question. The controller 5 also sets a threshold voltage for normal cases, and a threshold voltage for detection of wire break defect on the power lines 2 or a threshold voltage for detection of a deterioration defect in the connection terminals 11, compares the detected drop voltage to the threshold voltages, and detects the conduction state according to the result of the comparison.

In the present example, both wire break defects on the power lines 2 and deterioration defects in the connection terminals 11 are detected, but it would be acceptable to detect either wire break defects on the power lines 2 or deterioration defects in the connection terminals 11, but not both.

The aforedescribed holder 20 corresponds to the "holding part" of the present invention; the controller 5 to the "determining means," the deterioration determination interval and wire break determination interval to the "discharge threshold interval," the voltage sensor 4 to the "voltage detection part," the line 21 and the resistor 22 to the "conduction part," and the holder switch 23 to the "detection part."

The invention claimed is:

1. A charging apparatus comprising:
   a connector having a pair of connection terminals electrically connectable to an object to be charged;
   a pair of power lines electrically connected to the connection terminals;
   a charger configured to charge the object to be charged, the charger being connected to the power lines;
   a holding part configured to hold the connector when an electrical connection with the object to be charged is disestablished;
   a controller programmed to determine a conduction state on the power lines and the connection terminals; and
   a capacitor configured to accumulate a charge through the charger charging the object to be charged, the capacitor being connected to the power lines,
   the holding part having a conduction part that is configured to bring about conduction through the connection terminals while the electrical connection between the connection terminals and the object to be discharged is disestablished and the connector is held by the holding part, the controller determining the conduction state while the connector is being held by the holding part based on a discharge state when the charge is discharged via the power lines, the connection terminals, and the conduction part.

2. The charging apparatus according to claim 1, further comprising
   a voltage detection part arranged to detect a voltage of the capacitor;
   the controller determining the discharge state based on the voltage detected by the voltage detection part.

3. The charging apparatus according to claim 2, wherein the controller calculates a capacitor discharge interval based on the voltage detected by the voltage detection part, and detects the discharge state based on the capacitor discharge interval.

4. The charging apparatus according to claim 3, wherein the controller compares the discharge interval to a discharge threshold interval upon determining the conduction state is normal, and determines that a defect of the conduction state has arisen upon determining the discharge interval is longer than the discharge threshold interval.

5. The charging apparatus according to claim 4, wherein the controller sets the discharge threshold interval according to the voltage detected by the voltage detection part prior to discharging of the capacitor, and determines the conduction state according to a result of comparing the discharge interval and the discharge threshold interval.

6. The charging apparatus according to claim 4, wherein the controller calculates a drop voltage resulting from discharge of the capacitor based on the voltage detected by the voltage detection part, and detects the discharge state based on the drop voltage.

7. The charging apparatus according to claim 3, wherein the controller compares the discharge interval to a discharge threshold interval upon determining the conduction state is normal, and determines the state of deterioration of the connection terminals, according to a time difference between the discharge interval and the discharge threshold interval.

8. The charging apparatus according to claim 7, wherein the controller sets the discharge threshold interval according to the voltage detected by the voltage detection part prior to discharging of the capacitor, and determines the conduction state according to a result of comparing the discharge interval and the discharge threshold interval.

9. The charging apparatus according to claim 3, wherein the controller calculates a drop voltage resulting from discharge of the capacitor based on the voltage detected by the voltage detection part, and detects the discharge state based on the drop voltage.

10. The charging apparatus according to claim 3, wherein the holding part has a detection part for detecting that the connector is held, and
   when holding of the connector has been detected by the detection part, the capacitor discharges the charge.

11. The charging apparatus according to claim 3, wherein the conduction part has a resistor configured to consume the charge of the capacitor.

12. The charging apparatus according to claim 2, wherein the holding part has a detection part for detecting that the connector is held, and when holding of the connector has been detected by the detection part, the capacitor discharges the charge.

13. The charging apparatus according to claim 2, wherein the conduction part has a resistor configured to consume the charge of the capacitor.

14. The charging apparatus according to claim 1, wherein the controller calculates a drop voltage resulting from discharge of the capacitor based on the voltage detected by the voltage detection part, and detects the discharge state based on the drop voltage.

15. The charging apparatus according to claim 1, wherein the holding part has a detection part for detecting that the connector is held, and
   when holding of the connector has been detected by the detection part, the capacitor discharges the charge.

16. The charging apparatus according to claim 1, wherein the conduction part has a resistor configured to consume the charge of the capacitor.

17. A method for determining conduction state comprising:
- electrically connecting connection terminals of a connector to an object to be charged;
- charging the object to be charged via power lines electrically connected to the connection terminals, and accumulating charge in a capacitor configured to accumulate charge through the charger charging the object to be charged, the capacitor being connected to the power lines;
- following the charging of the object to be charged, electrically disconnecting the connection terminals from the object to be charged, causing the connector to be held by a holding part, and electrically connecting a conduction part included in the holding part to the power lines, the capacitor, and the connection terminals while the electrical connection between the connection terminals and the object to be discharged is disestablished and the connector is held by the holding part;
- following the connection of the conduction part, discharging the charge accumulated in the capacitor due to previously being charging;
- determining the conduction state while the connector is being held by the holding part based on the discharge state when the charge is discharged via the power lines, the connection terminals, and the conduction part; and
- determining the conduction state in the power lines and the connection terminals during the discharging of the charge accumulated in the capacitor, based on the discharge state of the capacitor.

* * * * *